(12) United States Patent
Pappas et al.

(10) Patent No.: US 10,250,022 B2
(45) Date of Patent: Apr. 2, 2019

(54) VERTICAL WALL MOUNT HOST ENCLOSURE

(71) Applicant: Middle Atlantic Products, Inc., Fairfield, NJ (US)

(72) Inventors: Andreas Pappas, Butler, NJ (US); John Franetovich, Glenwood, NJ (US)

(73) Assignee: Middle Atlantic Products, Inc., Fairfield, NJ (US)

( * ) Notice: Subject to any disclaimer, the term of this patent is extended or adjusted under 35 U.S.C. 154(b) by 0 days.

(21) Appl. No.: 15/905,073

(22) Filed: Feb. 26, 2018

(65) Prior Publication Data
US 2018/0248347 A1 Aug. 30, 2018

Related U.S. Application Data

(60) Provisional application No. 62/464,200, filed on Feb. 27, 2017.

(51) Int. Cl.
| | | |
|---|---|---|
| *H02B 1/40* | (2006.01) | |
| *H02B 1/44* | (2006.01) | |
| *H02G 3/08* | (2006.01) | |
| *H02G 3/10* | (2006.01) | |
| *H05K 5/00* | (2006.01) | |
| *H05K 5/02* | (2006.01) | |
| *H05K 7/14* | (2006.01) | |

(52) U.S. Cl.
CPC ............... *H02G 3/10* (2013.01); *H02B 1/40* (2013.01); *H02G 3/081* (2013.01); *H05K 5/0008* (2013.01); *H05K 5/0221* (2013.01); *H05K 7/14* (2013.01); *H02B 1/44* (2013.01); *H02G 3/086* (2013.01)

(58) Field of Classification Search
CPC .......... H02G 3/10; H02G 3/081; H02G 3/086; H02B 1/40; H02B 1/44; H05K 5/004; H05K 5/0204; H05K 5/0217; A47B 45/00; A47B 47/0066; A47B 47/0075
See application file for complete search history.

(56) References Cited

U.S. PATENT DOCUMENTS

| | | | |
|---|---|---|---|
| 7,188,570 B2 * | 3/2007 | Schluter | E05C 3/24 109/23 |
| 8,152,000 B2 | 4/2012 | Wagner et al. | |
| (Continued) | | | |

OTHER PUBLICATIONS

Black Hawk Labs, 6U + 4U MiniRaQ Convertible—Tall, May 19, 2017, https://www.bhlpower.com/index.cfm?page=products&productid=11; 1 page.

*Primary Examiner* — Daniel J Rohrhoff
(74) *Attorney, Agent, or Firm* — Drinker Biddle & Reath LLP (57) ABSTRACT

A wall mount enclosure has a backpan with a back panel and a plurality of side panels extending forwards from the back panel. A plurality of extensions are releasably attached to the backpan side panels and to adjacent extensions to form an extension assembly extending forwards from the backpan. The extension assembly as an assembly is releasable from and attachable to the backpan, and individual extensions are releasable from and attachable to the backpan and their respective adjacent extensions. At least one door is removably attached to one of the extensions and movable between a closed position and an open position.

9 Claims, 7 Drawing Sheets

(56) References Cited

U.S. PATENT DOCUMENTS

| | | | | |
|---|---|---|---|---|
| 8,212,144 B1* | 7/2012 | Gretz | ................... | H02G 3/086 |
| | | | | 174/480 |
| 8,680,407 B1* | 3/2014 | Chan | ..................... | H02G 3/086 |
| | | | | 174/50 |
| 2006/0102371 A1* | 5/2006 | Reynolds | ............... | H02G 3/086 |
| | | | | 174/50 |
| 2014/0090863 A1* | 4/2014 | Korcz | ................... | H02G 3/086 |
| | | | | 174/50 |
| 2014/0238738 A1* | 8/2014 | Korcz | ................... | H02G 3/086 |
| | | | | 174/542 |
| 2014/0262491 A1* | 9/2014 | Gardiner | ............... | H02G 3/086 |
| | | | | 174/562 |
| 2015/0101839 A1* | 4/2015 | Shiraki | ................. | H02G 3/088 |
| | | | | 174/50 |
| 2017/0201079 A1* | 7/2017 | Shiraki | ................. | B60R 16/02 |

\* cited by examiner

VERTICAL WALL MOUNT HOST ENCLOSURE

FIELD OF THE INVENTION

The application relates to a wall mount enclosure, especially but not exclusively for electrical and electronic equipment.

BACKGROUND

Wall-mountable cabinets for housing electrical and electronic equipment are known. Examples are shown in commonly assigned U.S. Pat. No. 7,188,570. However, there is still room for improvement.

SUMMARY

The present invention relates to wall mount enclosures with removable side panels for permitting expansion of the enclosure depending on the needs of the user. In one form of a wall mount enclosure disclosed, the enclosure comprises a backpan with a back panel and a plurality of side panels extending forwards from the back panel, a plurality of extensions releasably attached to the backpan side panels and releasably attached to adjacent ones of the plurality of extensions to form an extension assembly extending forwards from the backpan, wherein the extension assembly as an assembly is releasable from and attachable to the backpan, and wherein individual extensions are releasable from and attachable to the backpan and their respective adjacent extensions, and at least one door removably attaches to one of the extensions and is movable between a closed position in which the door obstructs access to at least part of an opening defined by front edges of the extensions and an open position in which the door does not obstruct access to an interior of the enclosure.

There may be two doors that in their open positions permit access to different parts of the interior. At least one of the doors may then be provided with a lock to secure the door in its closed position.

At least one door may have a base panel that is removably secured to at least one of the extensions and an access door that is rotatably attached to the base panel.

The backpan may have at least one support bracket with an array of mounting apertures. The extensions may be devoid of any provision for mounting of equipment, requiring that all equipment be mounted directly to the backpan or on supports that are mounted to the backpan without involving the extensions, except that light equipment may also be mounted on the inside of the door.

There may be at least one mounting bracket that comprises a bracket flange comprising at least one shovel lance with a joggled leg dimensioned to fit into a mounting aperture in the support bracket with the bracket flange abutting the support bracket, a mounting plate extending forward from the bracket flange and provided with a plurality of apertures permitting attachment of devices in vertical, horizontal, and diagonal orientations.

The bracket flange may be provided with at least two said shovel lances, spaced at a distance equal to a spacing of the corresponding mounting apertures or an integer multiple of the spacing of the corresponding mounting apertures.

The plurality of apertures in the mounting plate of the mounting bracket may comprise diagonally extending slots.

The mounting bracket may further comprise at least one flange extending from an edge of the mounting plate and provided with additional mounting apertures.

There may be at least one mounting rail for equipment, attached to the mounting plate and having a length direction that is parallel to a main plane of the mounting plate and is one of vertical, horizontal, and diagonal.

There may be first and second mounting brackets mounted level with each another on opposite sides of the backpan, and at least one mounting rail may then extend between and be attached to both of the first and second mounting brackets.

A kit of parts for a wall mount enclosure according to any of the above aspects may comprise the backpan, a set of extensions, and at least one door.

The kit of parts may further comprise a second set of extensions with a different size in a direction towards and away from the backpan.

Although specific features have been listed separately, combinations of two or more of those features, and/or other features shown in the detailed description below and/or in the drawings, are included in the subject matter of this specification.

BRIEF DESCRIPTION OF THE DRAWINGS

The above and other aspects, features, and advantages of the present invention may be more apparent from the following more particular description of embodiments thereof, presented in conjunction with the following drawings.

DESCRIPTION OF THE INVENTION

Figure 1:
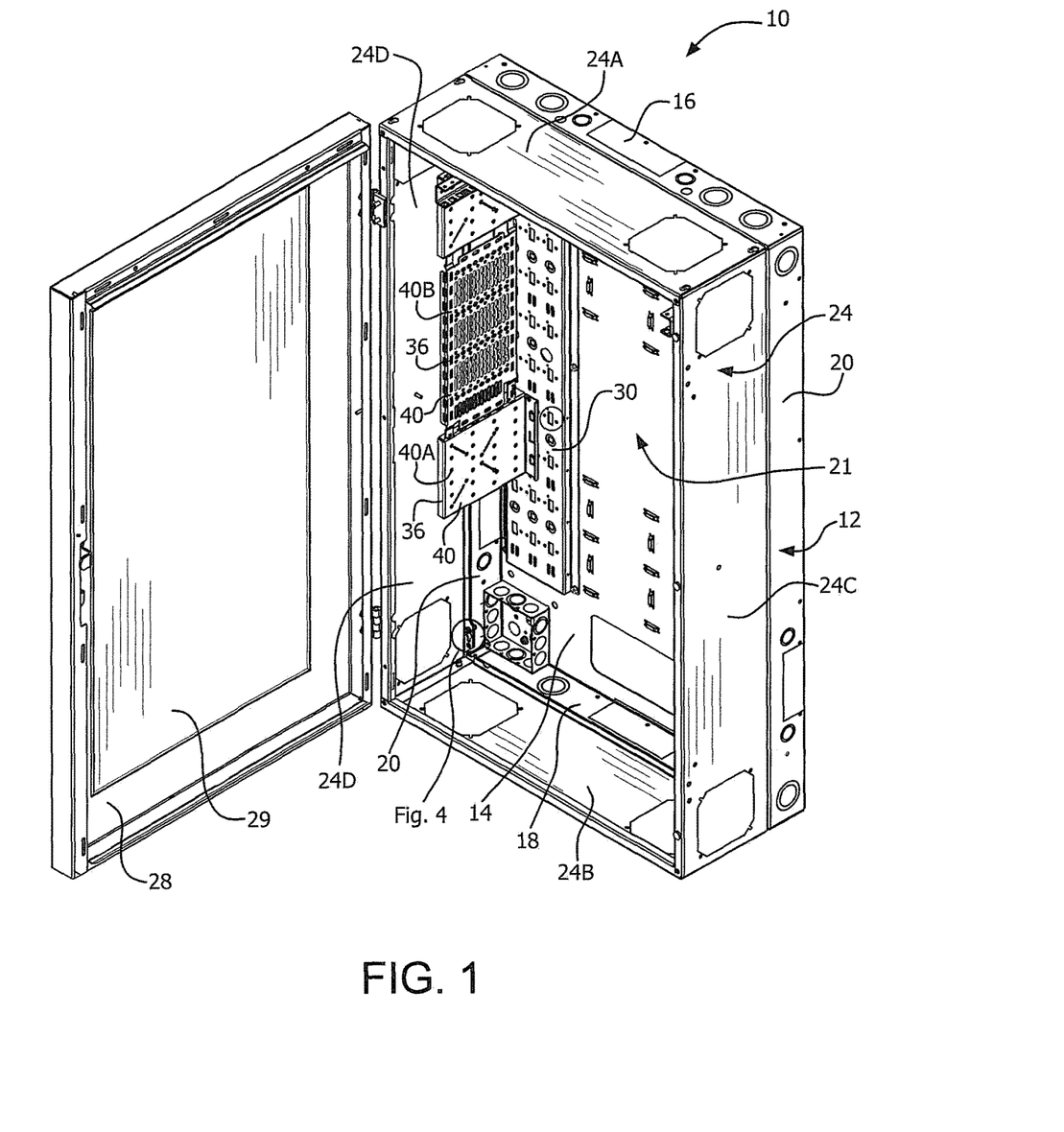
FIG. 1 is a perspective view of a vertical wall mount enclosure according to one embodiment of the invention with the enclosure door open and extension panels attached.
Figure 2:
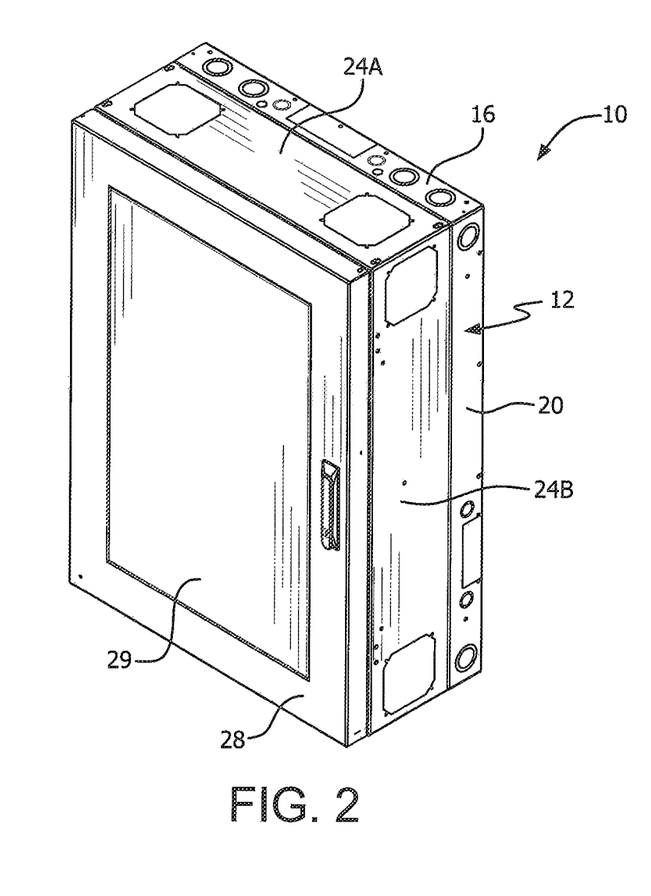
FIG. 2 is a perspective view of the enclosure of FIG. 1 with the door in its close position.
Figure 3:
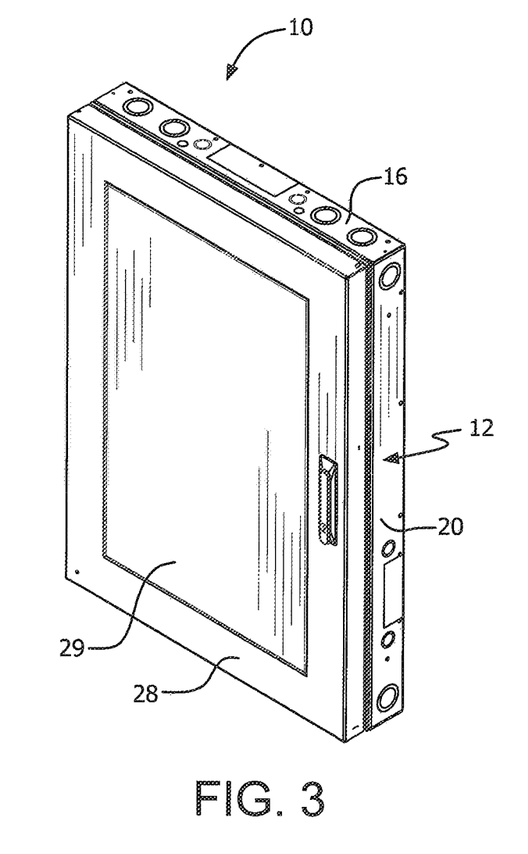
FIG. 3 is a perspective view of the enclosure of FIG. 1 with the door in its close position and without the extension panels attached.

Referring now to FIGS. 1-3 one embodiment of a vertical wall mount enclosure 10 according to the present invention is shown. The enclosure 10 includes a backpan 12 with a back panel 14 which is configured to mount to a supporting wall. The mounting to the wall can be through any conventional means such as bolts. In one embodiment bolts are appropriately attached to the wall and have a head that protrudes and is received in a slot (not shown) in the back panel 14. The bolt/slot attachment permits the backpan 12 to be removably attached to the wall.

The back pan 12 includes a top panel 16 and a bottom panel 18 that are preferably formed integral with a top edge and bottom edge, respectively, of the back panel 14. The top and bottom panels 16, 18 protrude away from the back panel 14 and the wall. In the illustrated embodiment, the top and bottom panels 16, 18 are relatively short in depth compared to the width of the back panel 14 so as to protrude outward a distance of about three (3) inches.

The backpan 12 also includes two side panels 20 that are preferably formed integral with opposite sides edges of the back panel 14. To provide additional stiffness, the side panels 20 are preferably attached to edges of the top and bottom panels 16, 18. The attachment is preferably through a fixed, non-removable attachment, such as welding, although it is also contemplated that the attachment could be removable, such as with screws or bolts. While the panels are integral in the preferred embodiment, it is also contemplated that they could be separate panels that are attached to one another. The combination of the top, bottom and side panels 16, 18, 20 and back panel 14 form the backpan 12 with an interior cavity 21 that has a shallow depth. As will be described in more detail below, the interior cavity 21 is intended to contain electrical equipment.

The top, bottom and side panels each have a backpan flange 22 (see FIG. 4) onto which are removably mounted one or more extensions 24. In the illustrated embodiment, there is a top extension 24A, a bottom extension 24B, and two side extensions 24C, 24D. More or less extensions can be used depending on the application. Each extension 24 is removably attached to a respective flange 22. In one embodiment, the removable attachment is through screws or bolts that attach a mounting flange 26 on each extension 24 to the backpan flange 22. Specifically, and with reference to FIG. 4, each mounting flange 26 preferably has a keyhole 23 through which a screw 25 is used to secure the extension 24 to the backpan 12. To provide further stability for the extensions, edges of the top extension 24A is removably secured to respective edges of the side extensions 24C and 24D. Similarly, edges of the bottom extension 24B are secured to the edges of the side extensions 24C and 24D. The securing of the extensions to one another is through screws or bolts. The extensions 24 are configured, when attached to the backpan 12, to extend the depth of the enclosure 10 and provide a larger interior cavity 21.

Figure 4:
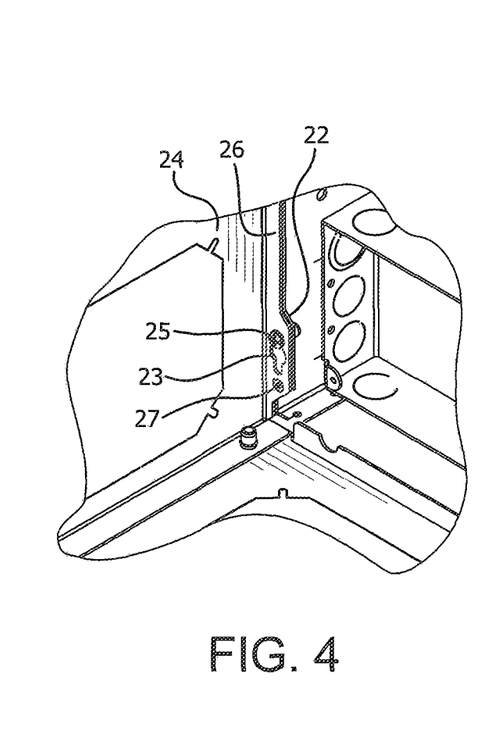
FIG. 4 is an enlarged view from FIG. 1 illustrating the mounting of an extension to the backpan.

In order to provide for proper grounding between the extensions and the backpan, a bonding screw 27 is preferably used to provide electrical continuity between the two components. In one embodiment, the bonding screw 27 is a flat head undercut (countersink) with teeth formed on the sloped surfaces of the head that are configured to scrape away paint or other surface coatings as the screw is tightened in order to provide a good conductive connection. Instead of a screw, a bolt could be used, such as the one disclosed in U.S. Pat. No. 8,070,404, the disclosure of which is incorporated herein by reference in its entirety.

It should be readily apparent that since the extensions 24 are secured to each other, by loosening the screws 25 and bonding screws 27, the entire extension 24 assembly can be removed. Alternatively, by loosening the screws 29 and bonding screws 27 securing one or more extensions 24 to the backpan 12, and the screws 25 and bonding screws between the one or more extensions and adjacent extensions, the one or more extensions can be removed without removing the entire extension assembly. FIG. 3 illustrates the enclosure 10 where the extensions 24 are removed and the door 28 secured directly onto the backpan 12. This configuration of the invention is particularly useful if only small electronics are mounted within the interior cavity 21. In the embodiment shown in FIGS. 1 and 2, as is discussed below, the mountings for equipment are on the backpan, and not on the extensions 24. Therefore, the extensions can easily be replaced with extensions having a different width in the direction towards and away from the backpan 12, to accommodate larger or smaller equipment, without needing to replace the entire enclosure, and indeed without disturbing equipment already mounted in the enclosure.

In the embodiment shown in FIGS. 1 and 2, the extensions 24 have a uniform depth. However, as will be discussed below, the extensions can have varying depths and sizes, permitting the enclosure 10 to have considerable versatility.

A door 28 is attached to one of the extensions 24 so as to permit access to the interior 21. In the illustrated embodiment, the door 28 is attached to one side extension 24D though hinges. The door 28 may include a transparent or translucent panel 29 for permitting viewing of the interior. It is contemplated that if the interior cavity does not need to be deep, the extensions 24 could be left off and the door could be attached to one of the one of the top, bottom or side panels 16, 18, 20.

Figure 5:
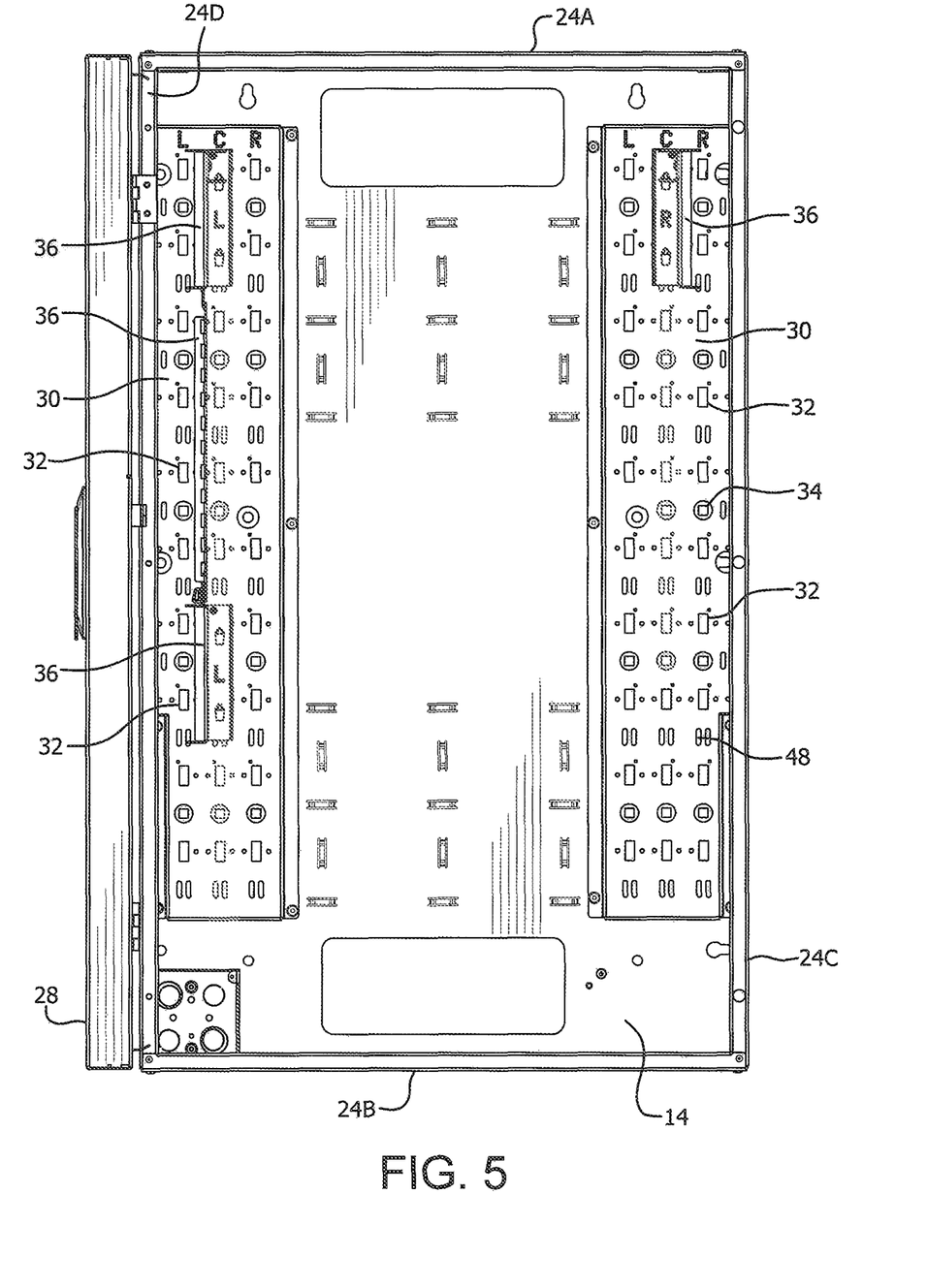
FIG. 5 is a front view of the enclosure of FIG. 1.

Mounted on the back panel 14 are one or more support brackets 30. The support brackets 30 include multiple mounting slots 32 and mounting apertures 34, preferably arranged in a series of alternating rows. In the illustrated embodiment of FIG. 5, there are preferably three slots on each row. The incorporation of multiple slots in each row and multiple rows provides various mounting locations for attaching brackets and equipment, allowing the installer to choose the optimum location and facilitate cable management. The support brackets 30 are rigidly attached to the back panel 14 so as to provide a fixed mounting surface that is secured to the enclosure 10. There are preferably at least two support brackets 30, one mounted on either side of the enclosure 10 adjacent to the side panels 20. As will become apparent, mounting brackets 36 can be mounted to each support bracket 30 so as to extend outward from the backpan 12. Cross members (not shown) that are conventional in the art could be attached between the mounting brackets to permit mounting equipment vertically as opposed to horizontally. This permits the efficient use of space in the enclosure.

Figure 6A:
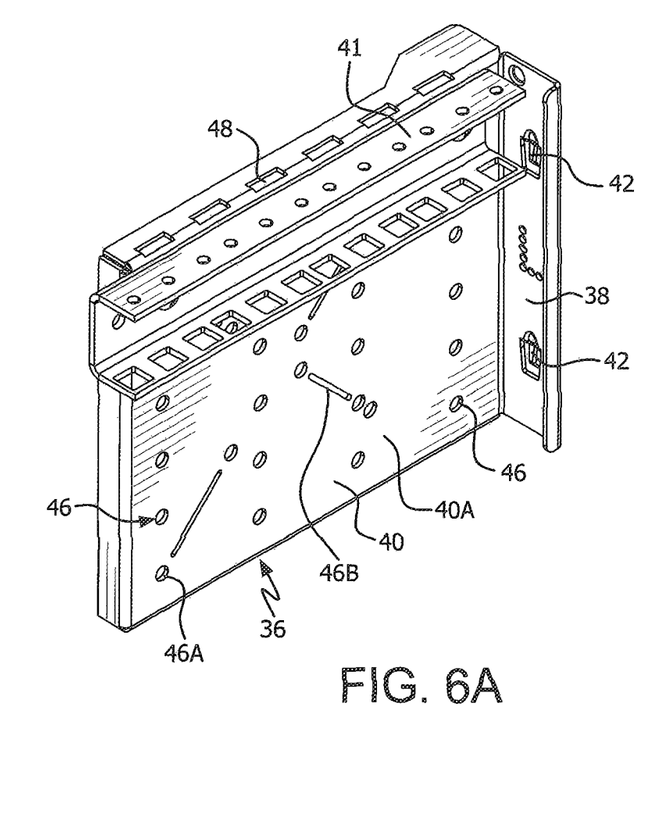
FIGS. 6A and 6B are a front perspective view and a rear perspective view, respectively, of one mounting bracket according to the present invention.
Figure 6B:
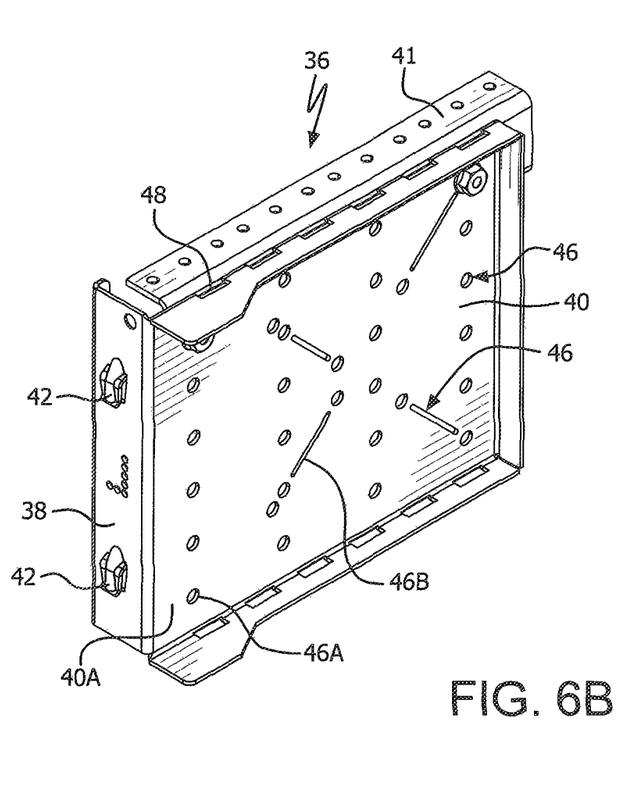

FIGS. 6A-6B illustrate one configuration for a mounting bracket 36 for removably attaching to the support bracket 30. The mounting bracket 36 includes a bracket flange 38 and a mounting plate 40. The bracket flange 38 includes at least one, and more preferably two or more, shovel lances 42 that include joggled legs spaced apart from the bracket flange 38. The legs of the shovel lances 42 are sized to fit into the slots 32 in the support bracket 30. As should be apparent, if there are more than one shovel lance 42 on a mounting bracket 36, the spacing of the shovel lances 42 is such that each of the shovel lances 42 is positioned to mate with a corresponding slot 32 in the support bracket 30. In order to provide for proper grounding, after a mounting bracket 36 is attached to the support bracket 30, a bonding screw, such as the one described above, is preferably used to provide electrical continuity between the two components.

The mounting plate 40 includes multiple spaced apart apertures 46 for mounting electrical equipment in various orientations. FIG. 1 illustrates two different aperture arrangements that can be used for mounting plates 40A and 40B. In one preferred arrangement of apertures 46 there are a plurality of spaced apart holes 46A arranged in two or more rows and columns, and four diagonal slots 46B. The diagonal slots 46B are arranged so as to form an X shape.

Figure 7A:
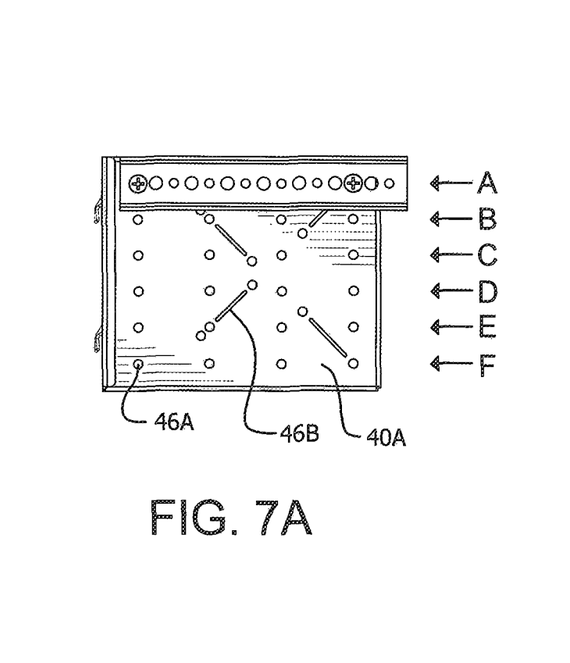
FIGS. 7A, 7B and 7C illustrate alternate equipment mounting positions using the mounting bracket of FIG. 6A.
Figure 7B:
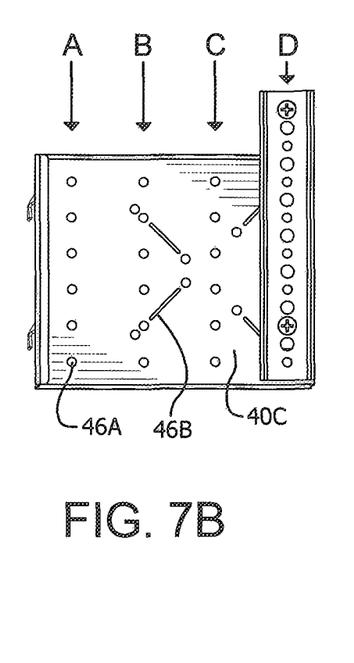
Figure 7C:
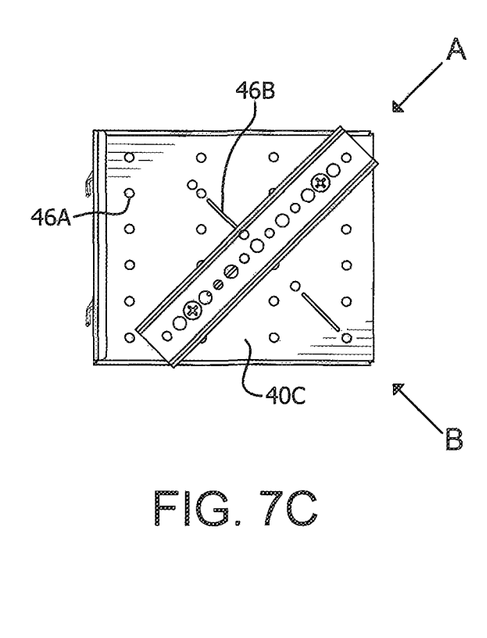

The unique layout of the apertures 46 in the mounting plate 40A permits multiple mounting configurations. For example, as shown in FIGS. 7A-7C, the aperture arrangement in mounting plate 40A permits six vertical mounting positions (vertical positions A-F in FIG. 7A), four horizontal mounting positions (horizontal positions A-D in FIG. 7B), and two diagonal mounting positions (diagonal positions A-B in FIG. 7C). As shown in mounting plate 40B of FIG. 1, the layout of the apertures 46 on the mounting plates 40 can vary depending on the anticipated needs of the user. As shown in FIG. 1, it is contemplated that multiple support bracket 30 could be mounted to the backpan 12 in the same (or differing) plane, and that mounting brackets 36 could be attached to each support bracket 30. One or more mounting rails 41 could be attached to each mounting bracket 36, preferably to the mounting plate 40A such that the length of the mounting rail 41 extends parallel to a main plane of the mounting plate. Alternately or in addition, one or more mounting rails 41 can be attached to mounting brackets 36 that are attached to adjacent, spaced apart support brackets 30 so that the mounting rail 41 extends across a portion of the width of the backpan 12.

As shown in the Figures, the support brackets 30 and mounting brackets 36 preferably include additional apertures that are in the shape of secondary slots 48 sized for use with a Lever Lock® locking mechanism for removably securing brackets to the support brackets 30 and mounting brackets 36. The Lever Lock® locking mechanism is sold by Middle Atlantic Products, Inc. and is described in U.S. Pat. No. 9,131,622, the disclosure of which is incorporated herein by reference in its entirety.

Figure 8:
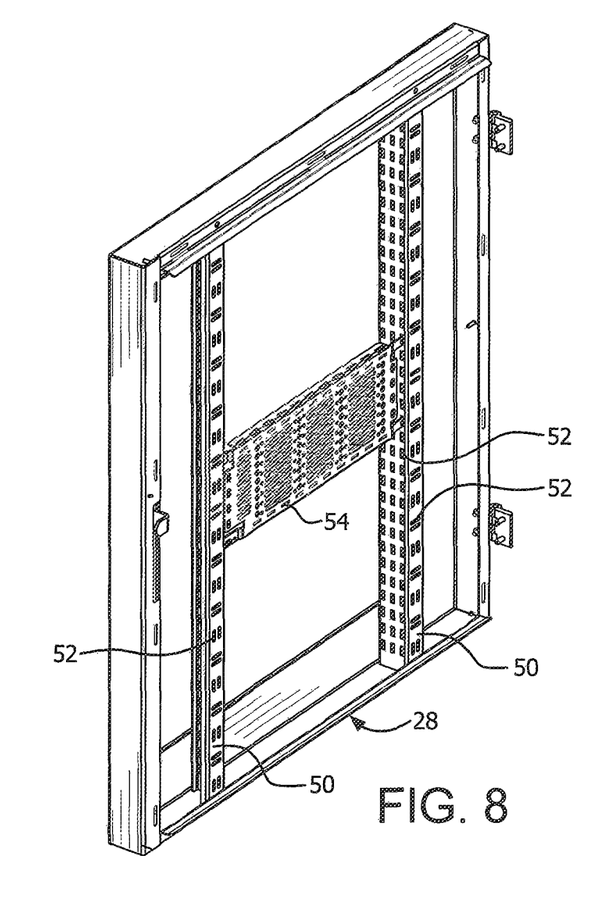
FIG. 8 is a perspective view of the door on the enclosure of FIG. 1.

Referring FIG. 8, the inside of the door 28 is shown with two optional door brackets 50 secured to the door 28. The door brackets 50 include a plurality of slots 52 sized for use with Lever Lock® locking mechanisms for removably securing additional brackets 54 to the door. This would be particularly useful for mounting small devices on the door, thereby freeing up space inside the enclosure cavity for larger items.

Figure 9A:
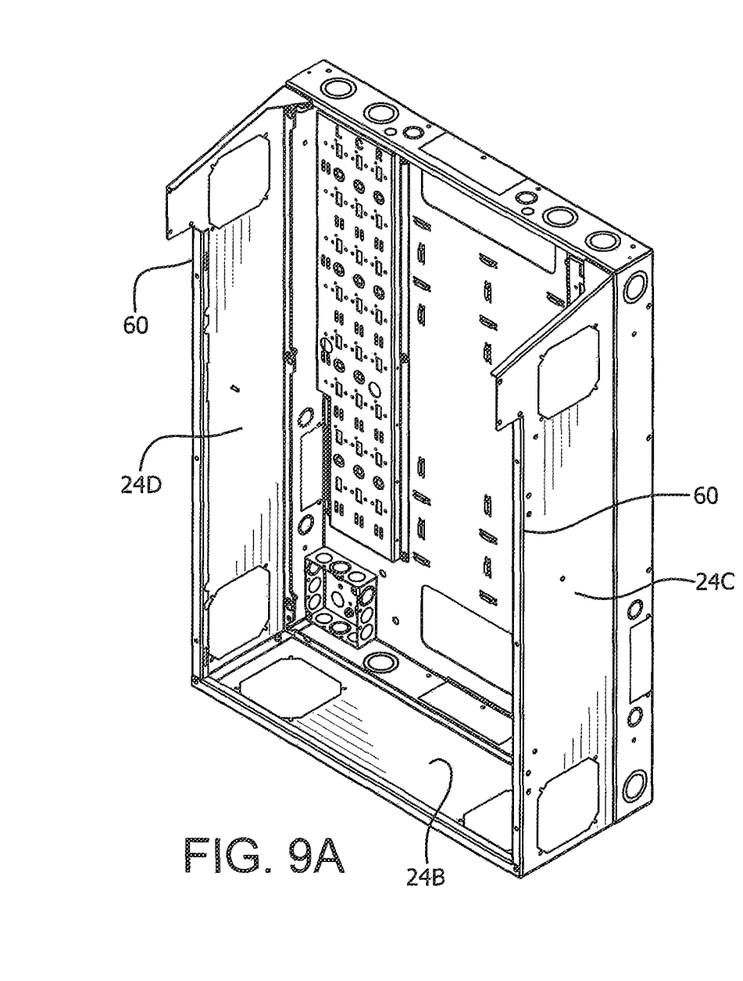
FIG. 9A is a perspective view of the enclosure with an alternate set of side extensions.
Figure 9B:
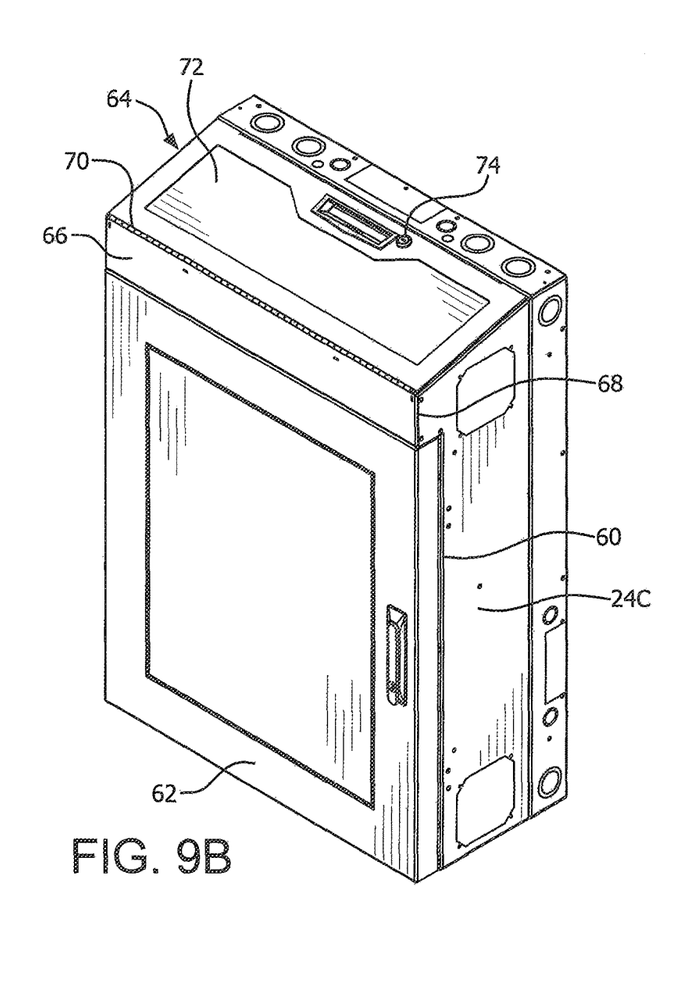
FIG. 9B is a perspective view of the enclosure of FIG. 9A with the door and access panels mounted to the extensions.

FIGS. 9A and 9B illustrate an alternate embodiment of the extension panels and door in the enclosure 10. In this embodiment, there is no top extension 24A and the side extensions 24C, 24D include a notched section 60 which is configured to permit mounting of a short door 62 that has a height less than the full height of the side extensions 24C, 24D. In place of the top extension, there is a secondary access door 64 that has a base panel 66 that is secured to the front edges 68 of the side extensions 24C, 24D. A hinge 70 connects the base panel 66 to an access door 72. A lock 74 may be included to restrict opening of the access door 72.

The benefit of the configuration shown in FIG. 9B is that once the electronics are mounted in the enclosure the use of two doors allows for limiting access to certain features and or components in the enclosure.

The ability to incorporate a variety of extensions permits the enclosure to be arranged in a variety of different configurations, facilitating the efficient and useful mounting of electrical components, either vertically or horizontally.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The invention claimed is:

1. A wall mount enclosure comprising:
a backpan with a back panel and a plurality of side panels extending forwards from the back panel;
a plurality of extensions releasably attached to the backpan side panels and releasably attached to adjacent ones of the plurality of extensions to form an extension assembly extending forwards from the backpan, wherein the extension assembly as an assembly is releasable from and attachable to the backpan, and wherein individual extensions are releasable from and attachable to the backpan and their respective adjacent extensions; and
at least one door removably attached to one of the extensions and movable between a closed position in which the door obstructs access to at least part of an opening defined by front edges of the extensions and an open position in which the door does not obstruct access to an interior of the enclosure;
wherein the at least one door comprises two doors that in their open positions permit access to different parts of the interior, and wherein at least one of the doors is provided with a lock to secure the door in its closed position.

2. A wall mount enclosure comprising:
a backpan with a back panel and a plurality of side panels extending forwards from the back panel;
a plurality of extensions releasably attached to the backpan side panels and releasably attached to adjacent ones of the plurality of extensions to form an extension assembly extending forwards from the backpan, wherein the extension assembly as an assembly is releasable from and attachable to the backpan, and wherein individual extensions are releasable from and attachable to the backpan and their respective adjacent extensions; and
at least one door removably attached to one of the extensions and movable between a closed position in which the door obstructs access to at least part of an opening defined by front edges of the extensions and an open position in which the door does not obstruct access to an interior of the enclosure;
wherein the at least one door comprises at least one door with a base panel that is removably secured to at least one of the extensions and an access door that is rotatably attached to the base panel.

3. A wall mount enclosure comprising:
a backpan with a back panel and a plurality of side panels extending forwards from the back panel;
a plurality of extensions releasably attached to the backpan side panels and releasably attached to adjacent ones of the plurality of extensions to form an extension assembly extending forwards from the backpan, wherein the extension assembly as an assembly is releasable from and attachable to the backpan, and wherein individual extensions are releasable from and attachable to the backpan and their respective adjacent extensions;
at least one door removably attached to one of the extensions and movable between a closed position in which the door obstructs access to at least part of an opening defined by front edges of the extensions and an open position in which the door does not obstruct access to an interior of the enclosure; and
at least one mounting bracket, wherein the mounting bracket comprises:

a bracket flange comprising at least one shovel lance with a joggled leg dimensioned to fit into a mounting aperture in the support bracket with the bracket flange abutting the support bracket;

a mounting plate extending forward from the bracket flange and provided with a plurality of apertures permitting attachment of devices in vertical, horizontal, and diagonal orientations.

4. The wall mount enclosure according to claim 3, wherein the bracket flange comprises at least two said shovel lances, spaced at a distance equal to a spacing of the corresponding mounting apertures or an integer multiple of the spacing of the corresponding mounting apertures.

5. The wall mount enclosure according to claim 3, wherein the plurality of apertures in the mounting plate of the mounting bracket comprise diagonally extending slots.

6. The wall mount enclosure according to claim 3, wherein the mounting bracket further comprises at least one flange extending from an edge of the mounting plate and provided with additional mounting apertures.

7. The wall mount enclosure according to claim 3, further comprising at least one mounting rail for equipment, attached to the mounting plate and having a length direction that is parallel to a main plane of the mounting plate and is one of vertical, horizontal, and diagonal.

8. The wall mount enclosure according to claim 3, further comprising a second mounting bracket, the first and second mounting brackets mounted level with each another on opposite sides of the backpan, and at least one mounting rail extending between and attached to both of the first and second mounting brackets.

9. The wall mount enclosure according to claim 3, wherein the extensions are free from any mounting structure for mounting brackets or equipment.

* * * * *